United States Patent
Liu et al.

(10) Patent No.: US 6,323,121 B1
(45) Date of Patent: Nov. 27, 2001

(54) FULLY DRY POST-VIA-ETCH CLEANING METHOD FOR A DAMASCENE PROCESS

(75) Inventors: Jen-Cheng Liu, Chia-Yi; Chao-Cheng Chen, Matou; Li-Chih Chao, Yang-Mei; Chia-Shiung Tsai, Hsin-Chu; Ming-Huei Lui, Panchiao, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/570,018

(22) Filed: May 12, 2000

(51) Int. Cl.$^7$ ................................................ H01L 21/4763
(52) U.S. Cl. .......................... 438/633; 438/597; 438/738; 430/314; 430/329; 430/330; 156/345; 156/630; 156/643
(58) Field of Search ..................................... 438/633, 597, 438/738; 430/329, 314, 330; 156/345, 630, 643

(56) References Cited

U.S. PATENT DOCUMENTS

| 5,453,157 | 9/1995 | Jeng | 156/659.11 |
| 5,741,626 | 4/1998 | Jain et al. | 430/314 |
| 5,773,201 | 6/1998 | Fujimura et al. | 430/329 |
| 5,877,075 | 3/1999 | Dai et al. | 438/597 |
| 5,882,996 | 3/1999 | Dai | 438/597 |
| 5,916,823 | 6/1999 | Lou et al. | 438/738 |

OTHER PUBLICATIONS

Chang et al., "ULSI Technology", McGraw–Hill Companies, Inc. New York, (1996), pp. 444–445.

El–Kareh et al., "Fundamentals of Semiconductor Pro–cessing Technologies", Kluwer Academic Publishers, Boston, (1995), pp. 563–564.

Primary Examiner—Richard Elms
Assistant Examiner—Pho M. Luu
(74) Attorney, Agent, or Firm—George O. Saile; Stephen B. Ackerman

(57) ABSTRACT

A method is described for cleaning freshly etched dual damascene via openings and preparing them for copper fill without damage or contamination of exposed organic or other porous low-k insulative layers. The method is entirely dry and does not expose the porous materials to contamination from moisture or solvents. The method is effective for removing all traces of residual polymer deposits from an in-process substrate wafers after via or damascene trench etching. The method employs an in-situ three-step treatment comprising a first step of exposing the electrically biased substrate wafer to a $O_2/N_2$ ashing plasma to remove photoresist and polymers, a second step immediately following the first step of remove silicon nitride etch stop layers, and a final step of treating the wafer with $H_2/N_2$ to remove copper polymer deposits formed during nitride removal. The $H_2/N_2$ plasma is capable of removing the difficult polymer residues which are otherwise only removable by wet stripping procedures. The $H_2/N_2$ plasma is not harmful to exposed porous low-k dielectric layers as well as copper metallurgy.

22 Claims, 3 Drawing Sheets

FULLY DRY POST-VIA-ETCH CLEANING METHOD FOR A DAMASCENE PROCESS

BACKGROUND OF THE INVENTION (1) Field of the Invention

The invention relates to processes for the manufacture of semiconductor devices and more particularly to the formation of copper interconnective metallization by a damascene process.

(2) Background of the Invention and Description of Related Art

Integrated circuits are manufactured by forming discrete semiconductor devices in the surface of silicon wafers. A multi-level metallurgical interconnection network is then formed over the devices, contacting their active elements, and wiring them together to create the desired circuits. The wiring layers are formed by depositing an insulating layer over the discrete devices, patterning and etching contact openings into this layer, and then depositing conductive material into the openings. A conductive layer is applied over the insulating layer and patterned to form wiring interconnections between the device contacts, thereby creating a first level of basic circuitry. The circuits are then further interconnected by utilizing additional wiring levels laid out over additional insulating layers with conductive via pass throughs. Depending upon the complexity of the overall integrated circuit, several levels of wiring interconnections are used.

A method for forming the interconnection layer is the damascene process, whereby openings and trenches, comprising an image of the interconnection pattern are formed in an insulative layer. A metal layer is then deposited into the openings and over the insulative layer. Finally, the metal is polished back to the insulative layer leaving the metal pattern inlaid within the insulative layer. Polishing back of the metal layer is accomplished by CMP (chemical mechanical polishing), a relatively old process which has found new application in planarization of insulative layers and more recently in the damascene process. In a single damascene process a metal line pattern is generated which connects to subjacent vias or contacts. In a dual damascene process, both vias/contacts and an interconnective wiring pattern are formed by a single metal deposition and CMP. A description of both single and dual damascene processes may be found in Chang, C. Y. and Sze, S. M., "ULSI Technology" McGraw-Hill, N.Y., (1996), p444–445 and in El-Kareh, B., "Fundamentals of Semiconductor Processing Technologies", Kluwer, Boston(1995), p563–4. The dual damascene process has been particularly favored for the manufacture of integrated circuits using copper metallurgy. Copper is rapidly replacing aluminum as the metallurgy of choice in integrated circuit manufacturing because it has a higher conductivity than aluminum. The use of copper results in greatly improved circuit performance.

In dual damascene processing, the deep via openings are first partially patterned with a first photoresist mask. Then, using a second photoresist mask, the shallower metal interconnective wiring channels are etched as the vias openings are etched to completion. Often, etch stop layers are used to limit the etching at both the deep and shallow levels. Dai, et.al., U.S. Pat. Nos. 5,877,075 and 5,882,996 show methods for etching both levels using a single photoresist layer, which is patterned twice. Silicon nitride is typically used as an etch stop.

In order to further improve circuit performance, low dielectric constant (low-k) insulative materials have been incorporated into the dielectric layers of modern integrated circuits. These materials provide a lower capacitance than conventional silicon oxide and consequently, an increase in circuit speed. Lou, et.al., U.S. Pat. No. 5,916,823 shows a method for forming a dual damascene structure using a low-k SOG (spin-on-glass). SOGs are alcohol soluble siloxanes or silicates which are spin deposited and baked to drive off solvents resulting in a relatively porous silicon oxide structure. Other porous silica structures such as xerogels have been developed, notably by Texas Instruments Inc. and incorporated into dual damascene processes to obtain insulative layers with dielectric constants as low as 1.3. This is to be compared with a dielectric constant of about 4 for conventional silicon oxide. Other organic and quasi-organic materials such as polysilsesquioxanes and polyarylene ethers have been added to the growing family of low-k and ultra low-k insulative materials. The materials are deposited either by spin-on deposition or by CVD (Chemical vapor deposition).

Although these materials offer welcome improvement in circuit performance, they also pose problems in processing. Because they are very porous, they are not only prone to absorb and retain contaminants, in particular moisture and solvents, but they also react to a large extent with wet processing chemistries such as those used for cleaning and removing residues left after plasma etching and photoresist stripping. In Dai, solvents are removed by baking and a cap oxide liner is deposited on the walls of the etched damascene openings to seal the SOG surfaces against contamination. Whereas Dai uses an oxygen ashing process followed by wet stripping with $H_2SO_4$, $H_2O_2$, and $NH_4OH$ to remove photoresist and other residues after the via etch such treatment would be damaging to OSOGs (organic spin-on-glasses) and some other low-k insulative materials including those deposited by CVD.

Jeng, U.S. Pat. No. 5,453,157 teaches an anisotropic, low temperature (−40° C. to 20° C.), oxygen plasma ashing process which does not harm the exposed edges of low-k OSOG underlayers. The ashing plasma is made directional with respect to the wafer by biasing the wafer to attract the positively charged oxygen species. In addition, the wafer must be cooled during the ashing, for example by liquid nitrogen.

Fujimura, et.al., U.S. Pat. No. 5,773,201 teaches another photoresist ashing process wherein ashing takes place in a chamber located downstream of an oxygen plasma source. It is shown that hydrogen or water vapor, added to the oxygen plasma, lowers the activation energy of the ashing process. However, hydrogen addition, even in small amounts, creates an explosion hazard. The addition of nitrogen or water vapor to the oxygen plasma increases the ashing rate by increasing the concentration of oxygen atoms in the plasma.

Jain, et.al., U.S. Pat. No. 5,741,626 teaches the use of $Ta_3O_5$ as an insulative ARC (anti-reflective coating) and etch stop material for forming dual damascene structures. The insulative property is advantageous when the ARC is used other than directly beneath the photoresist layer, for example between the two main dielectric layers of the dual damascene structure. $Ta_2O_5$ reduces the reflectivity of a subjacent aluminum layer by about a factor of 5.

Porous doped silicates such as fluorinated and carbon doped silicate glasses and totally organic, non silicaceous, materials such as fluorinated polyarylene ethers, are seeing an increased usage in semiconductor processing technology because of their favorable dielectric characteristics and ease of application. These materials are, however, particularly susceptible to etch erosion and contamination from wet etchant and stripping chemistries which have heretofore not been particularly problematic. Complex polymeric residues often result from the reactions of dry etchant components and a variety of organic and inorganic (primarily silicaceous), materials exposed during plasma etching. CVD deposited fluorinated silicate glasses and carbon doped silicates are also susceptible to erosion and contamination by wet etchants.

In addition, wet etchant chemistries also cause damage to exposed copper surfaces which are exposed in certain copper damascene via processes wherein the wet etch clean is used after copper is exposed at the base of the via openings. These residues may no longer be removed by conventional wet etching because of the interaction of the wet etchants with exposed low-k dielectric layers. Oftentimes, for reasons of design or process integration, the edges of low-k dielectric layers, cannot be sealed in the manner of Lou, '823, to prevent exposure of the edges to a wet cleaning step.

It is therefore desirable to have a totally dry process which provides a highly but not totally anisotropic cleaning action without damaging or contaminating exposed lateral edges of low-k organic and doped silicaceous structural layers. In addition, the process should provide means to protect metal exposed at the base of the via opening. The method taught by this invention is such a process.

SUMMARY OF THE INVENTION

Accordingly, it is an object of this invention to provide a totally dry method for removing photoresist and sidewall polymer from a freshly etched damascene via opening, removing an etch stop at the base of the via opening, and cleaning out copper polymers left by the etch stop removal process, without damaging or contaminating exposed low-k dielectric layers.

It is another object of this invention to provide a dry method for cleaning a via opening to copper metallization without damage or contamination of exposed copper.

It is yet another object of this invention to provide an all-dry method for removing residual polymer deposits from in-process substrate wafers.

These objects are accomplished by an in-situ three-step plasma treatment comprising a first step of exposing the substrate wafer, after via etching, to a $O_2/N_2$ ashing plasma, a second step immediately following the first step in the same chamber, and without breaking vacuum, of removing the etch stop layer and a third step of treating the wafer with a $H_2/N_2$ plasma to remove copper polymer residues which remain after the etch stop removal. The $H_2/N_2$ plasma is capable of removing difficult polymer residues which are otherwise only removable by wet stripping procedures. The $H_2/N_2$ plasma is not harmful to the exposed porous low-k dielectric layers. Because the process is completely dry, the absorption of moisture or solvents by porous low-k layers is avoided.

DESCRIPTION OF THE PREFERRED EMBODIMENTS

In a first embodiment of this invention a p-type <100> oriented monocrystalline silicon wafer substrate is provided.

Figure 1A:
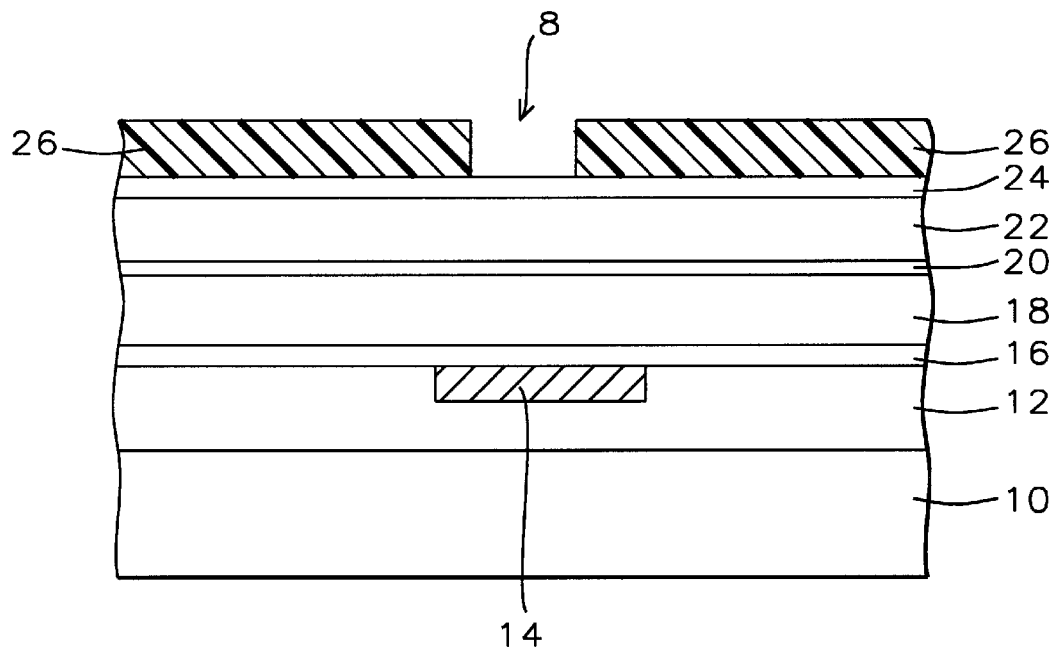
FIG. 1A through FIG. 1F are cross sections of a silicon wafer illustrating a sequence of processing steps for forming a via and a layer of copper metallization in the presence of low-k insulative layers by a dual damascene process according to an embodiment of this invention.

Referring to FIG. 1A, silicon substrate 10 is provided with a substructure of devices formed in the substrate and/or metal layers thereof, and as they are not significant to the invention, they are not described in detail in order not to unnecessarily obscure the present invention. An insulative layer 12 is formed on the substrate 10 and a copper wiring layer is formed in the upper portion of the layer 12. The copper wiring layer 14 is shown embedded in the figure as it is formed by a damascene process. Alternately, the wiring layer 14 may comprise aluminum, an aluminum alloy, tungsten, a tungsten alloy, or a copper alloy. The surface of the insulative layer 12 and the embedded metal wiring 14 is planarized by CMP.

Alternately, the copper wiring layer may be formed by another process. In the present embodiment the insulative layer 12 is preferably silicon oxide, although it may alternatively be formed of another insulative material, for example BPSG (borophosphosilicate glass), PSG (phosphosilicate glass), an organic polymer, an organosilicate glass, a fluorinated silicate glass, a xerogel, an aerogel, or a polysilsesquioxane. The insulative layer 12 is formed by PECVD (plasma enhanced chemical vapor deposition) although other deposition means may alternately be used to deposit layer 12. However, PECVD is preferred because of the low deposition temperature. The wiring layer 14 is interconnected to elements of the devices located in the wafer 10 substructure.

A layer of silicon nitride 16 is deposited on the insulative layer 12 by PECVD to a thickness of between about 500 and 1,000 Angstroms. Alternately, another of a number of well known deposition methods may be employed to deposit the layer 16. The silicon nitride layer will serve as an etch stop during subsequent via etching and also as a chemical barrier.

A low-k dielectric layer 18 is next formed over the wafer 10 by a CVD method, preferably by HDP (high density plasma) CVD or by PECVD to a thickness of between about 0.5 and 0.7 microns. CVD deposited low-k materials which may be used include fluorinated silicate glasses (FSG), sometimes called fluorinated oxide, Organosilicate glasses (OSG), for example Black Diamond™, from Applied Materials Corporation of Santa Clara Calif., films formed from a methylated silane, and the more recently investigated FLAC (fluorinated amorphous carbon) films.

A second layer of silicon nitride 20 is next deposited on the low-k layer 18 by PECVD. Again, another deposition means may alternately be used to deposit this layer, however, PECVD is preferred because of the beneficial low deposition temperature. The silicon nitride layer 20 is deposited to a thickness of between about 300 and 500 Angstroms. A second low-k dielectric layer 22 is deposited on the silicon nitride layer 20 using the same procedures as are employed in the formation of the first low-k dielectric layer 18. The second low-k layer 22 is between about 0.5 and 1.0 microns thick and may be formed of the same low-k material as the first low-k layer 18 or of one of the alternate low-k material cited above for the layer 18.

A layer of silicon oxynitride 24 is deposited on the second low-k dielectric layer 22. The silicon oxynitride layer 24 is deposited by PECVD using $SiH_4$ and $N_2O$ in a He carrier gas and is between about 200 and 600 Angstroms thick. Process parameters for PECVD deposition of silicon oxynitride are well known to those skilled in the art.

Photoresist 26 is applied and patterned to form a mask which defines an opening 8 overlying the copper wiring 14. The silicon oxynitride layer 24 serves as a BARC (bottom anti-reflective coating) during the photoresist exposure. The wafer 10 is then inserted in the etching chamber of a plasma etching tool, for example, a MERIE (magnetically enhanced reactive ion etching) tool.

The via opening 8 is etched in a single operation, by reactive ion etching sequentially, through the silicon oxynitride layer 24, the low-k dielectric layer 22, the silicon nitride layer 20 and the low-k dielectric layer 18, stopping on the silicon nitride layer 16. Reactant gas mixtures and etching parameters are adjusted for each layer to achieve a high etch rate for each layer as it is reached. An endpoint sensor, such as an optical emission spectrometer, provides continuous monitoring of the etching process and indicates when etchant gases are to be changed to accommodate either a nitride layer or an insulative layer. The nitride layers are etched with a gas mixture containing a fluorocarbon such as $CF_4$ and oxygen, while the insulative layers are etched with fluorocarbons alone, for example $CHF_3$ or $C_4F_8$. Etchant gas mixtures and plasma parameters for etching the various layers are well known to those in the art and can be experimentally optimized for each application. Stopping on the silicon nitride layer 16 is easily achieved by utilizing etching parameters which provide a high insulative layer-to-silicon nitride selectivity.

The wafer 10 is next transferred from the etching tool into a plasma ashing chamber. The plasma ashing chamber may be in a separate tool or it may also be a second chamber of the RIE tool. Residual photoresist 26 and polymer deposits developed during RIE are removed by ashing in with a $O_2/N_2$ gas mixture. $O_2$ is flowed at a rate of between about 20 and 80 SCCM (standard cubic centimeters per minute) and $N_2$ at a flow rate of between about 20 and 80 SCCM. The pumping speed is throttled to maintain the ashing chamber pressure at between about 50 and 100 milliTorr. The temperature of the wafer is maintained at between about 40 and 60° C. by controlling the temperature of a pedestal in the ashing tool upon which the wafer rests. In addition, the wafer is electrically biased to provide directionality to the plasma.

After the residual photoresist has been removed, the via opening may be optionally subjected to a hydrogen plasma in order to remove any residual polymer which may be left after the ashing. After the ashing and without breaking vacuum, the gas mixture is changed to one of $H_2$ and $N_2$ while maintaining a plasma. $H_2$ is flowed at a rate of between about 100 and 500 SCCM and $N_2$ at a rate of between about 100 and 500 SCCM. The pumping speed is throttled to maintain a chamber pressure of between about 50 and 100 milliTorr and the wafer temperature maintained between about 40 and 60° C.

Figure 1B:
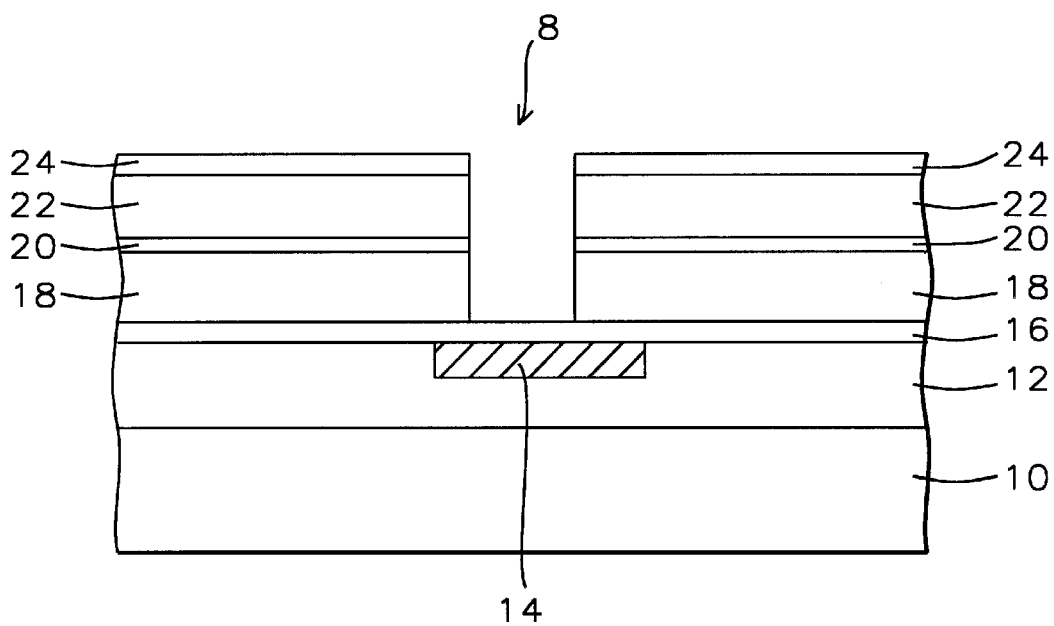

The $H_2/N_2$ plasma cleans away any polymer, formed during via etching, which may be difficult to remove by the oxygen ashing alone. The $H_2/N_2$ plasma treatment is applied for a period of between about 20 and 40 seconds. The completed via opening 8 is shown in FIG. 1B. The silicon nitride etch stop layer 16 is retained at the bottom of the opening 8 to protect the subjacent metal from corrosion or other chemical attack.

Figure 1C:
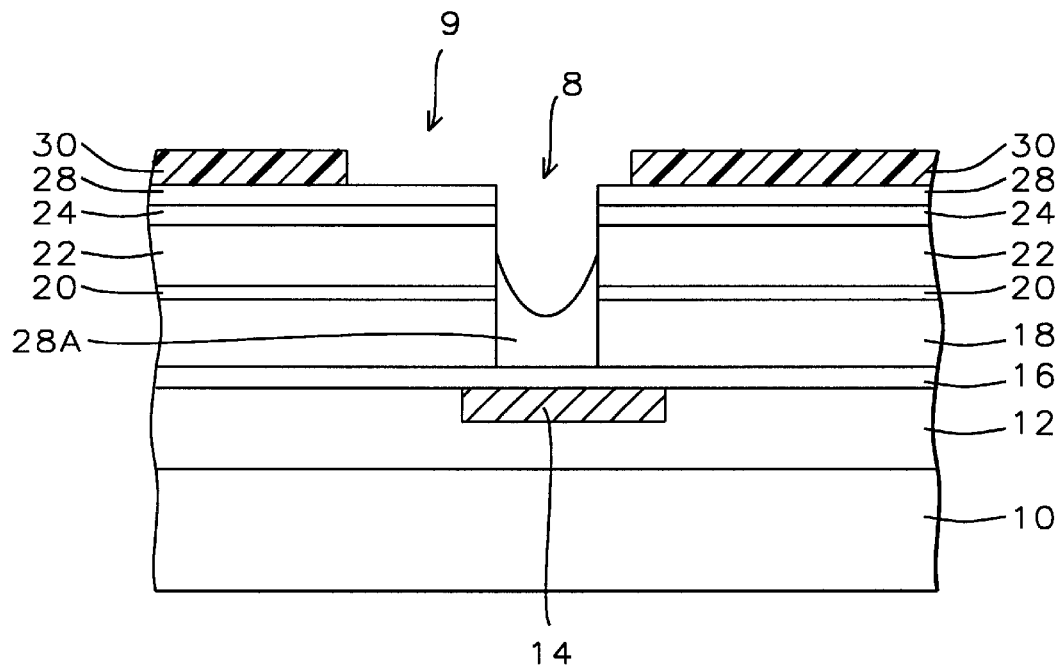

Referring next to FIG. 1C, an organic BARC (bottom anti reflective coating) 28 is applied over the wafer 10 by a spin-on technique. Any conventional organic BARC material may be used. The BARC 28 is formed by first depositing a liquid monomer onto the wafer from a nozzle as the wafer 10 is spun on a wafer spinner. This method of film deposition is well known and widely practice in the art. The thickness of the BARC 28 is determined by the viscosity of the liquid monomer and the spinning speed of the wafer. The organic BARC 28 is thermally cured resulting in a final thickness of between about 1,000 and 2,000 Angstroms.

Although the silicon oxynitride BARC 24 still remains over the low-k layer 22, the spun-on BARC 28 has the added purpose of protecting the nitride etch stop layer 16 at the bottom of the trench 8. When the BARC 28 is spun onto the wafer, a portion 28A is captured and retained in the opening 8 during the spin-on process. The portion 28A is much thicker than the BARC 28 over the planar regions and subsequently, enough remains to protect the silicon nitride layer 16 at the base of the opening 8 during subsequent etching of the wider or trench portion of the dual damascene structure.

Figure 1D:
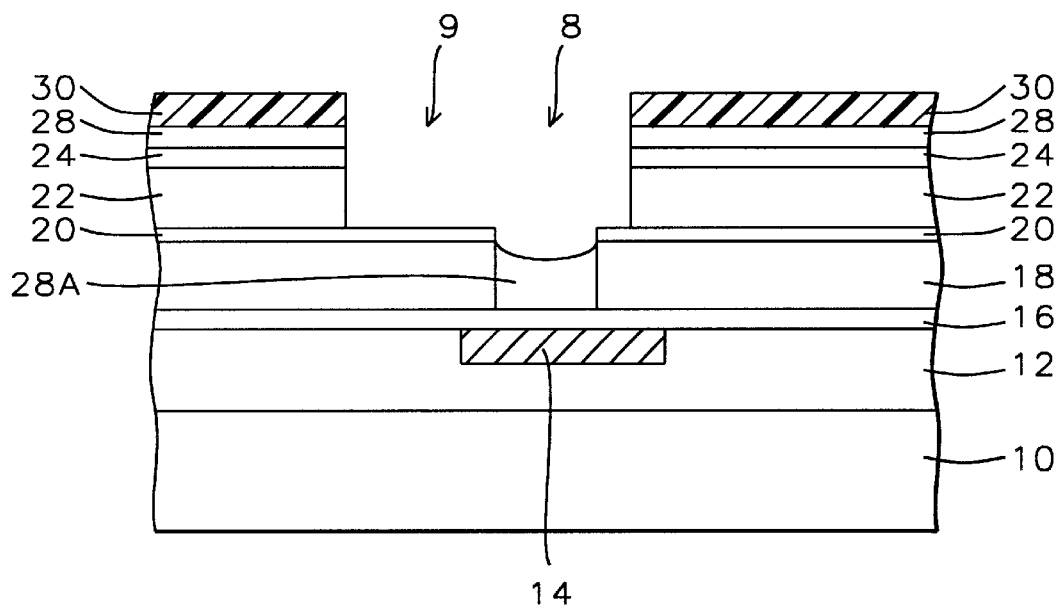

A photoresist layer 30 is next patterned on the wafer 10 to define the wider or trench portion 9 of the dual damascene structure. Referring to FIG. 1D, the BARC 28, the silicon oxynitride layer 24, and the low-k organic layer 22 are etched to the silicon nitride etch stop layer 20, forming the trench 9. The etching process is accomplished in the same etching chamber that was previously used to form the via opening 8. The wafer 10 is next transferred to the ashing chamber and the residual photoresist layer 30, the thin BARC 28 under the photoresist, as well as the BARC portion 28A in the via opening are removed by ashing in a $O_2/N_2$ plasma. The $O_2$ is flowed at a rate of between about 20 and 80 SCCM and $N_2$ at a flow rate of between about 20 and 80 SCCM. The chamber pumping speed is throttled to maintain a chamber pressure of between about 50 and 100 milliTorr. During ashing a bias power of between about 500 and 700 Watts is applied to the substrate to provide plasma directionality and the temperature of the wafer is maintained at between about 40 and 60° C. by controlling the temperature of a pedestal in the ashing tool upon which the wafer rests.

Figure 1E:
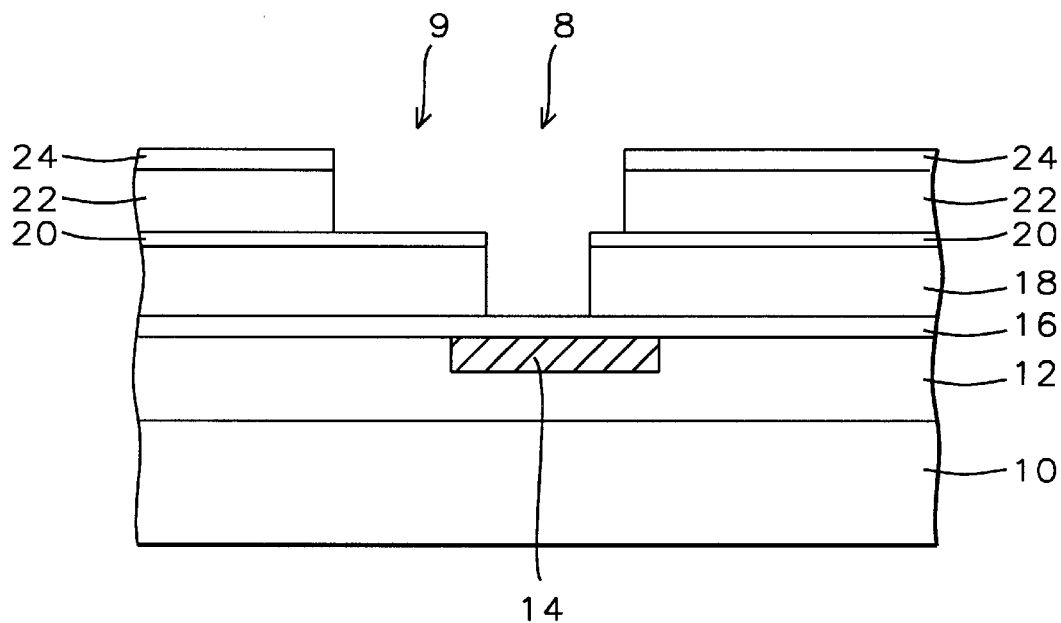

FIG. 1E shows the structure after the $O_2/N_2$ ashing treatment. In order to prepare the dual damascene opening 8,9 for copper deposition, the silicon nitride layer 16 must be removed at the base of the via opening 8. This is accomplished directly after the $O_2/N_2$ ashing treatment, and in the same chamber without breaking vacuum, by plasma etching in a plasma containing fluorocarbons and oxygen. Fluorocarbon/oxygen etchant gas mixtures and plasma parameters for etching silicon nitride are well known to those in the art and can be experimentally optimized to etch the nitride with minimum over-etch. A bias power of between about 500 and 700 Watts is applied to the substrate to provide plasma directionality. The silicon nitride layer 16 in the via opening 8 as well as the exposed portions of the silicon nitride layer 20 and the silicon oxynitride BARC 24 are removed with negligible attack of the low-k dielectric layers. The silicon oxynitride 24 and the exposed silicon nitride 20 are concurrently removed along with the exposed etch stop nitride 16.

After the exposed nitride and oxynitride have been removed by the fluorocarbon etch, polymeric copper residues remain in the opening 8. These residues comprise Cu—F and Cu—O polymers which are formed at the end of the nitride etching by reaction of the fluorocarbon etchant gases with the freshly exposed copper wiring 14 at the base of the via opening 8. In an alternate instance when the wiring layer 14 is of another metal, corresponding residues may be formed by attack of the metal by the silicon nitride etchant gas. These residues must be removed to from within the opening 8 prior to the copper damascene metallization in order to achieve a good ohmic contact.

Directly after the fluorocarbon nitride etch the copper polymer residues are removed with a $H_2/N_2$ plasma etch within the same chamber and without breaking vacuum. The a gas mixture is changed to one consisting of $H_2$ at a flow rate of between about 100 and 500 SCCM and $N_2$ at a flow rate of between about 100 and 500 SCCM. The chamber pumping speed is throttled to maintain a chamber pressure of between about 50 and 100 milliTorr while the wafer temperature is maintained between about 40 and 60° C. The $H_2/N_2$ plasma cleans away the copper polymer residues leaving a clean copper surface at the base of the via opening 8. The $H_2/N_2$ treatment is applied for a period of between about 20 and 40 seconds.

Figure 1F:
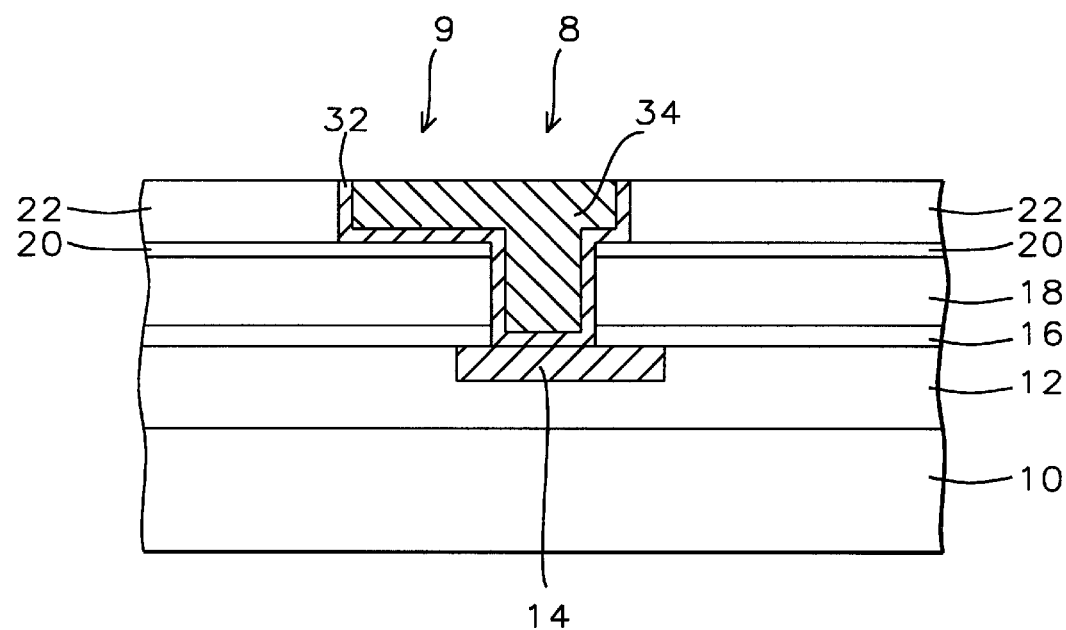

Referring to FIG. 1F, the damascene trench 9 and via 8 are lined with a barrier layer 32 comprising TaN. Alternately another barrier layer configuration such as TaN/Ta or TiN may be used. A layer of copper 34 is deposited to fill the opening 8,9. Deposition of the copper layer can be by PVD (physical vapor deposition) methods such as sputtering or vacuum evaporation, or by CVD (chemical vapor deposition), or by ECD (electrochemical deposition). The ECD method involves placing the wafer into an electrolyte bath and electro plating a metal layer onto the wafer surface by applying of an electric field between the wafer and the electrolyte. The ECD method has been found to be particularly desirable for the deposition of copper. Methods for barrier formation and copper deposition on dual damascene structures are well known in the art and need not be described in detail here. Following deposition the layer is planarized by CMP to expose the dielectric layer 22 completing the formation of the damascene metallization.

While the embodiment of the invention utilizes a CVD deposited low-k dielectric layers for each of the two insulative sections of the dual damascene structure, the procedures taught by this invention for forming and cleaning a dual damascene structure can be applied equally well using other low-k insulative materials such as the various porous low-k siliceous dielectric materials deposited either by CVD or by spin-on techniques, such as aerogels, silica gels, or polysilsesquioxanes. In addition the all dry via forming process taught by this invention may be applied when conventional dielectrics such as silicon oxide, BPSG, PSG, and are used to form the layers which abut the via.

While the embodiment describes the formation of a damascene structure, it is to be understood that the all-dry, in-situ processing sequence of $O_2/N_2$ ashing, plasma nitride removal, and final $H_2/N_2$ copper polymer removal, taught by this invention, may be equally well applied to the formation of a simple via in a single insulative layer having a silicon nitride etch stop over a subjacent copper pattern. After the via is patterned to the etch stop, the all dry sequence is applied to remove the etch stop and clean the via in preparation for the metallization.

While the invention has been particularly shown and described with reference to the preferred embodiments thereof, it will be understood by those skilled in the art that various changes in form and details may be made without departing from the spirit and scope of the invention. The terms "dielectric" and "insulative" are used interchangeably, the word "dielectric" being used when the context refers to the dielectric property of an insulative material.

What is claimed is:

1. A method for patterning and cleaning a via opening comprising:
   (a) providing a wafer having an etch stop over a metal pattern and an insulative layer over said etch stop;
   (b) patterning a photoresist mask on said insulative layer to define a via opening;
   (c) anisotropically etching said insulative layer to said etch stop thereby forming a via opening;
   (d) ashing said wafer in a plasma containing oxygen and nitrogen;
   (e) after step (d) and without breaking vacuum, removing said etch stop at the base of said via opening by plasma etching in an etchant gas plasma containing fluorocarbons whereby a polymeric residue is formed by attack of said etchant gas plasma on said metal pattern which is exposed by said etching; and
   (f) after step (e) and without breaking vacuum, subjecting said wafer to a hydrogen plasma treatment thereby removing said polymeric residue.

2. The method of claim 1 wherein said metal pattern is copper.

3. The method of claim 1 wherein said etch stop is silicon nitride.

4. The method of claim 1 wherein said insulative layer is selected from the group consisting of silicon oxide, a phosphosilicate glass, a borophosphosilicate glass, an organic polymer, an organosilicate glass, a fluorinated silicate glass, a xerogel, an aerogel, and a polysilsesquioxane.

5. The method of claim 1 wherein said insulative layer is deposited by chemical vapor deposition.

6. The method of claim 1 wherein said ashing is conducted in a chamber with a plasma containing $O_2$ at a flow rate of between about between about 20 and 80 SCCM and $N_2$ at a flow rate of between about 20 and 80 SCCM at a chamber pressure of between about 50 and 100 milliTorr.

7. The method of claim 1 wherein said plasma etching is accomplished in a plasma containing fluorocarbons and oxygen.

8. The method of claim 1 wherein said hydrogen plasma treatment is conducted a plasma containing $H_2$ at a flow rate of between about 100 and 500 SCCM and $N_2$ at a flow rate of between about 100 and 500 SCCM at a chamber pressure of between about 50 and 100 milliTorr for a period of between about 20 and 40 seconds.

9. The method of claim 1 wherein the temperature of said wafer is controlled to between about 40 and 60° C. during said ashing, said plasma etching, and said hydrogen treatment.

10. The method of claim 1 wherein a bias power of between about 500 and 700 watts is applied to said wafer during said ashing, said plasma etching, and said hydrogen treatment.

11. A method for forming a dual damascene structure comprising:
   (a) providing a substrate wafer having a first etch stop over a metal wiring pattern and a first insulative layer over said first etch stop;
   (b) forming a second etch stop over said first insulative layer;
   (c) depositing a second insulative layer over said second etch stop;
   (d) depositing a first BARC (bottom anti-reflective coating) on said second insulative layer;
   (e) patterning a first photoresist mask over said first BARC to define a via opening;
   (f) anisotropically etching said first BARC, said second insulative layer, said second etch stop, and said first insulative layer, stopping in said first etch stop thereby forming a via opening;
   (g) ashing said wafer in a first plasma containing oxygen;
   (h) after step (g) and without breaking vacuum, subjecting said wafer to a second plasma containing hydrogen;

(i) depositing an organic BARC on said wafer, whereupon said via opening is partially filled with organic BARC material;

(j) curing said organic BARC;

(k) patterning a second photoresist mask over said organic BARC to define a wiring trench;

(l) anisotropically etching said organic BARC, said first BARC, and said second insulative layer, stopping on said second etch stop thereby forming a wiring trench;

(m) ashing said wafer in a third plasma containing oxygen;

(n) after step (m) and without breaking vacuum, removing exposed said first etch stop in said via opening by plasma etching, thereby exposing said metal wiring and forming a dual damascene opening;

(o) after step (n) and without breaking vacuum, subjecting said wafer to a fourth plasma containing hydrogen for a time period; and (p) depositing a conductive material in said dual damascene opening; and (q) chemical mechanical polishing said conductive material to form a dual damascene wiring structure.

12. The method of claim 11 wherein said first and said second etch stop is silicon nitride.

13. The method of claim 11 wherein said first BARC is silicon oxynitride.

14. The method of claim 11 wherein said first and said second insulative layers are selected from the group consisting of silicon oxide, a phosphosilicate glass, a borophosphosilicate glass, an organic polymer, an organosilicate glass, a fluorinated silicate glass, a xerogel, an aerogel, and a polysilsesquioxane.

15. The method of claim 11 wherein said first and said second etch stops comprise silicon nitride.

16. The method of claim 11 wherein said first plasma and said third plasma contains $O_2$ at a flow rate of between about between about 20 and 80 SCCM and $N_2$ at a flow rate of between about 20 and 80 SCCM and at a chamber pressure of chamber pressure of between about 50 and 100 milliTorr.

17. The method of claim 11 wherein said plasma etching is accomplished in a plasma containing fluorocarbons and oxygen.

18. The method of claim 11 wherein said fourth plasma contains $H_2$ at a flow rate of between about 100 and 500 SCCM and $N_2$ at a flow rate of between about 100 and 500 SCCM at a chamber pressure of between about 50 and 100 milliTorr.

19. The method of claim 11 wherein the temperature of said wafer is controlled to between about 40 and 60° C. during said ashing, said plasma etching, and said hydrogen treatment.

20. The method of claim 11 wherein a bias power of between about 500 and 700 watts is applied to said wafer during said ashing, said plasma etching, and said hydrogen treatment.

21. The method of claim 11 wherein said metal wiring pattern is selected from the group containing aluminum, an aluminum alloy, tungsten, a tungsten alloy, copper, and a copper alloy.

22. The method of claim 11 wherein said dual damascene wiring structure is formed of copper.

* * * * *